(12) United States Patent
Taruki (10) Patent No.: US 11,523,081 B2
(45) Date of Patent: Dec. 6, 2022

(54) SOLID-STATE IMAGING DEVICE (71) Applicants: Kabushiki Kaisha Toshiba, Tokyo (JP); Toshiba Electronic Devices & Storage Corporation, Tokyo (JP)

(72) Inventor: Hisayuki Taruki, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 39 days.

(21) Appl. No.: 17/002,973

(22) Filed: Aug. 26, 2020

(65) Prior Publication Data
US 2021/0297624 A1    Sep. 23, 2021

(30) Foreign Application Priority Data
Mar. 19, 2020 (JP) .............................. JP2020-049758

(51) Int. Cl.
*H04N 5/3745* (2011.01)
*H01L 27/146* (2006.01)
(Continued)

(52) U.S. Cl.
CPC ... *H04N 5/37457* (2013.01); *H01L 27/14612* (2013.01); *H01L 27/14636* (2013.01);
(Continued)

(58) Field of Classification Search
CPC .. H04N 5/37457; H04N 5/3765; H04N 5/378; H04N 5/3745; H01L 27/14612;
(Continued)

(56) References Cited

U.S. PATENT DOCUMENTS 6,507,365 B1 * 1/2003 Nakamura ............. H04N 5/374
348/E3.019
7,821,551 B2 10/2010 Shinohara
(Continued)

FOREIGN PATENT DOCUMENTS

JP    2005-328275 A    11/2005
JP    2010-178117 A    8/2010
(Continued)

*Primary Examiner* — Albert H Cutler
(74) *Attorney, Agent, or Firm* — Allen & Overy LLP (57) ABSTRACT

A solid-state imaging device includes a plurality of pixel cells, each of the pixel cells including a light receiving element, a floating diffusion, a first source follower circuit, and a second source follower circuit. The plurality of pixel cells are connected to an output signal line. The light receiving element photoelectrically converts incident light, and stores a signal charge. The floating diffusion converts the signal charge read out of the light receiving element into a signal voltage. The first source follower circuit is connected to the floating diffusion, and outputs an output voltage corresponding to the signal voltage. The second source follower circuit is connected in series with the first source follower circuit, and outputs a pixel signal corresponding to the output voltage.

10 Claims, 7 Drawing Sheets

(51) Int. Cl.
*H04N 5/376* (2011.01)
*H04N 5/378* (2011.01)
*H01L 27/148* (2006.01)

(52) U.S. Cl.
CPC .. *H01L 27/14643* (2013.01); *H01L 27/14831* (2013.01); *H04N 5/378* (2013.01); *H04N 5/3765* (2013.01)

(58) Field of Classification Search
CPC ......... H01L 27/14636; H01L 27/14643; H01L 27/14831
See application file for complete search history.

(56) References Cited

U.S. PATENT DOCUMENTS

| | | | |
|---|---|---|---|
| 9,948,877 B2 | 4/2018 | Iwane et al. | |
| 10,347,681 B2 * | 7/2019 | Kurokawa | H04N 5/378 |
| 10,404,933 B2 | 9/2019 | Iwane et al. | |
| 2010/0271517 A1 * | 10/2010 | De Wit | H04N 5/378 348/294 |
| 2013/0070133 A1 | 3/2013 | Takazawa | |
| 2016/0139276 A1 | 5/2016 | Naito | |
| 2017/0104946 A1 * | 4/2017 | Hong | H04N 5/37452 |
| 2020/0021759 A1 | 1/2020 | Tashiro | |
| 2021/0014444 A1 * | 1/2021 | Geurts | H04N 5/378 |
| 2021/0084247 A1 * | 3/2021 | Yin | H04N 5/359 |
| 2021/0289154 A1 * | 9/2021 | Johnson | H04N 5/378 |

FOREIGN PATENT DOCUMENTS

| | | |
|---|---|---|
| JP | 2012-248953 A | 12/2012 |
| JP | 2016-095278 A | 5/2016 |
| JP | 61069125 A | 3/2017 |
| JP | 2018-170543 A | 11/2018 |

\* cited by examiner

RESULT OF COMPARISON BETWEEN RESPECTIVE INPUT SIGNALS OF FLOATING DIFFUSIONS 23 AND 63

RESULT OF COMPARISON BETWEEN RESPECTIVE VOLTAGE CHANGES OF OUTPUT SIGNAL LINES 14 AND 54

FIG. 7

SOLID-STATE IMAGING DEVICE

CROSS REFERENCE TO RELATED APPLICATION

This application is based upon and claims the benefit of priority from Japanese Patent Application No. 2020-049758, filed Mar. 19, 2020; the entire contents of which are incorporated herein by reference.

FIELD

Embodiments described herein relate generally to a solid-state imaging device.

BACKGROUND

Conventionally, a solid-state imaging device includes a pixel array having a plurality of pixel cells arranged therein, the pixel cells being respectively provided with light receiving elements such as photodiodes, and generates a picked-up image based on pixel signals respectively acquired by the light receiving elements.

The plurality of pixel cells are connected to an output circuit in a succeeding stage via an output signal line, and respectively output the pixel signals to an output circuit. To reduce a chip size and reduce power consumption, the plurality of pixel cells share a constant current source and an output circuit to be connected to the output signal line. Accordingly, the output signal line increases in a wiring length, and increases in a resistance and a capacitance.

DETAILED DESCRIPTION

A solid-state imaging device according to an embodiment includes a plurality of pixel cells, each of the pixel cells including a light receiving element, a floating diffusion, a first source follower circuit, and a second source follower circuit. The plurality of pixel cells are connected to an output signal line. The light receiving element photoelectrically converts incident light, and stores a signal charge. The floating diffusion converts the signal charge read out of the light receiving element into a signal voltage. The first source follower circuit is connected to the floating diffusion, and outputs an output voltage corresponding to the signal voltage. The second source follower circuit is connected in series with the first source follower circuit, and outputs a pixel signal corresponding to the output voltage.

Embodiments will be described in detail below with reference to the drawings.

First Embodiment

Figure 1:
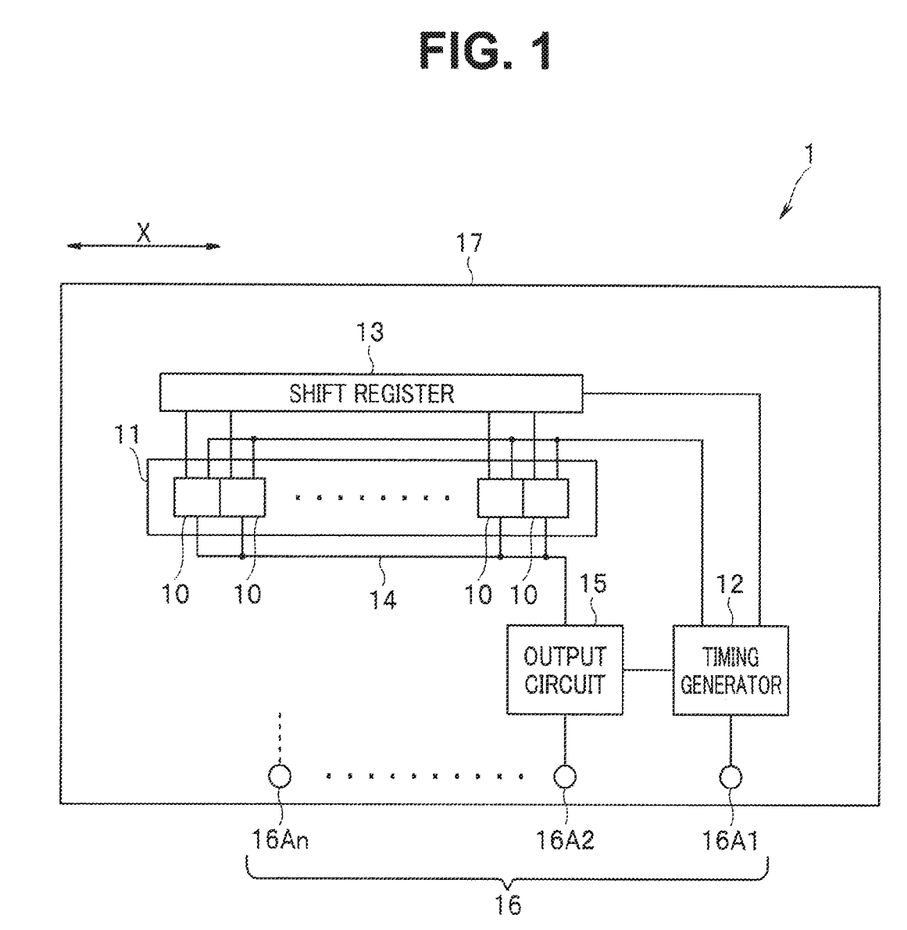
FIG. 1 is a configuration diagram illustrating an example of an entire configuration of a solid-state imaging device according to a first embodiment.

FIG. 1 is a configuration diagram illustrating an example of an entire configuration of a solid-state imaging device according to a first embodiment.

Although a solid-state imaging device 1 according to the present embodiment is configured as a CMOS linear image sensor, the present embodiment is not limited to this. For example, the solid-state imaging device 1 can also be configured as a CMOS area image sensor.

The solid-state imaging device 1 includes a pixel array 11 including a plurality of pixel cells 10, a timing generator 12, a shift register 13, an output signal line 14, an output circuit 15, and a plurality of input/output pads 16A1 to 16An (n is an integer of 3 or more). The solid-state imaging device 1 includes at least three or more input/output pads such as an input/output pad configured to supply a power supply voltage in addition to an input/output pad 16A1 connected to the timing generator 12 and an input/output pad 16A2 connected to the output circuit 15. Note that all or some of the plurality of input/output pads 16A1 to 16An are referred to as an input/output pad 16 when collectively designated in the following description.

The pixel array 11, the timing generator 12, the shift register 13, the output signal line 14, the output circuit 15, and the plurality of input/output pads 16 are arranged on a silicon substrate 17. The plurality of pixel cells 10 are arranged to have a linear shape in a horizontal direction (an X-direction illustrated in FIG. 1).

A control signal is inputted from the input/output pad 16A1 to the timing generator 12. The timing generator 12 generates a pulse signal for controlling the plurality of pixel cells 10, the shift register 13, and the output circuit 15 according to the control signal. The timing generator 12 outputs a transfer control signal TS for controlling transfer of a signal charge in a transfer transistor 22, described below, and a reset signal RS for discharging a charge in a floating diffusion 23, described below, to the plurality of pixel cells 10.

The shift register 13 generates an address signal (selection signal) AD for selecting the pixel cell 10 that outputs a pixel signal based on the pulse signal from the timing generator 12.

The pixel signal outputted from the pixel cell 10 is inputted to the output circuit 15 via the output signal line 14. The output circuit 15 outputs the pixel signal, which has been subjected to various types of signal processing such as clamping processing for suppressing the pixel signal to have a predetermined voltage amplitude and amplification processing, to outside via the input/output pad 16A2.

Circuit Configuration of Pixel Cells in Comparative Example

Figure 2:
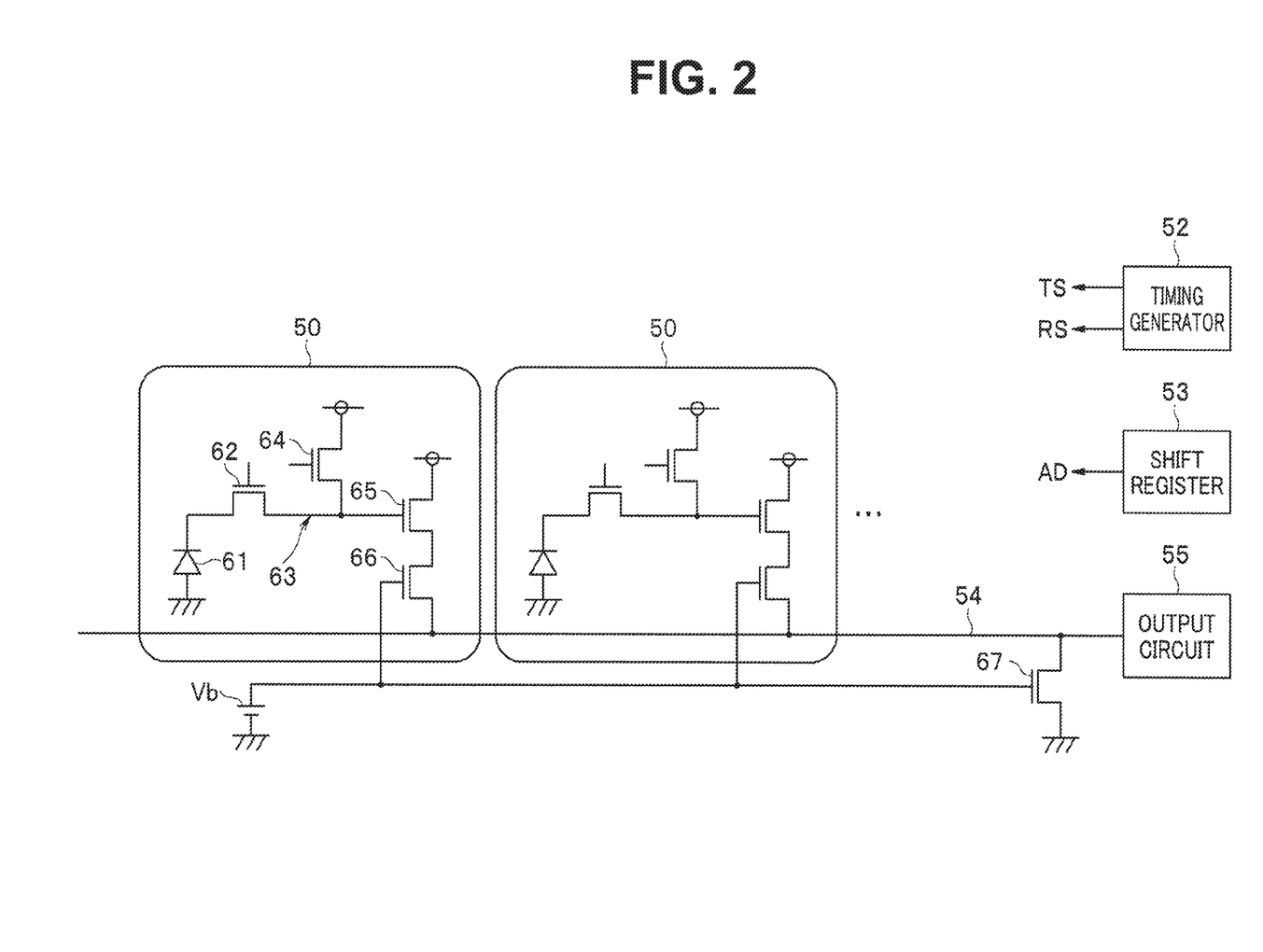
FIG. 2 is a diagram illustrating an example of a circuit configuration of pixel cells in a comparative example.

FIG. 2 is a diagram illustrating an example of a circuit configuration of pixel cells in a comparative example. In FIG. 2, the circuit configuration will be described as pixel cells 50, a timing generator 52, a shift register 53, an output signal line 54, and an output circuit 55.

The pixel cell 50 includes a photodiode 61, a transfer transistor 62, a floating diffusion 63, a reset transistor 64, an amplifier transistor 65, and an address transistor 66.

The photodiode 61 as a light receiving element photoelectrically converts incident light, and stores a signal charge. The transfer transistor 62 reads out the signal charge stored in the photodiode 61 and transfers the read signal charge to the floating diffusion 63 in response to a transfer control signal TS from the timing generator 52. The floating diffusion 63 converts the transferred signal charge into a signal voltage. The reset transistor 64 connects the floating diffusion 63 to a power supply voltage and discharges the signal charge in response to a reset signal RS from the timing generator 52.

In the comparative example, the amplifier transistor 65 and a load transistor 67 constitute a source follower circuit. A pixel signal corresponding to the signal voltage of the floating diffusion 63 inputted to a gate of the amplifier transistor 65 is outputted to the output circuit 55.

The address transistor 66 brings the amplifier transistor 65 and the load transistor 67 into a connected state or a disconnected state and controls on/off of the source follower circuit in response to an address signal AD inputted from the shift register 53.

The plurality of pixel cells 50 share the load transistor 67 and the output circuit 55, and are connected to one another by the output signal line 54. In other words, the plurality of address transistors 66 are connected to the output signal line 54. Accordingly, a wiring length of the output signal line 54 is long, and a resistance and a capacitance significantly larger than a resistance and a capacitance of the floating diffusion 63 as an input are added to the output signal line 54.

When the charge obtained by the photoelectric conversion is inputted to the floating diffusion 63, the voltage of the floating diffusion 63 changes so that a voltage of the output signal line 54 changes. Since the floating diffusion 63 is a floating node, a part of a voltage change of the output signal line 54 is fed back to the floating diffusion 63 by capacitive coupling between the floating diffusion and the output signal line 54.

Letting $\Delta V\_FD$ be a voltage change of the floating diffusion 63 due to the charge obtained by the photoelectric conversion, $G1$ be a gain of the amplifier transistor 65, $C\_FD$ be a capacitance of the floating diffusion 63, $C\_FDOUT1$ be a capacitance between the floating diffusion 63 and the output signal line 54, the voltage of the floating diffusion 63 varies as represented by the following expression (1).

$$\Delta V\_FD \times G1 \times C\_FDOUT1/C\_FD \qquad (1)$$

The voltage of the output signal line 54 changes due to the voltage variation of the floating diffusion 63, and the voltage variation is repeated until convergence of the change in the voltage.

If the resistance and the capacitance of the output signal line 54 are large, feedback to an input by an output signal is also delayed. This presents an obstacle to higher-speed reading of a pixel signal. Note that C_FDOUT1 also includes a capacitance of the amplifier transistor 65. Even if a channel width of the amplifier transistor 65 is increased to achieve higher speed, C_FDOUT1 increases, and feedback to the floating diffusion 63 increases so that an effect of increasing the speed of the reading of the pixel signal is not obtained.

Even when the gain G1 of the amplifier transistor 65 is increased or the capacitance C_FD is reduced to achieve lower noise and higher sensitivity, the feedback to the floating diffusion 63 increases so that an effect of increasing the speed of the reading of the pixel signal is not obtained.

Circuit Configuration of Pixel Cells in First Embodiment

Figure 3:
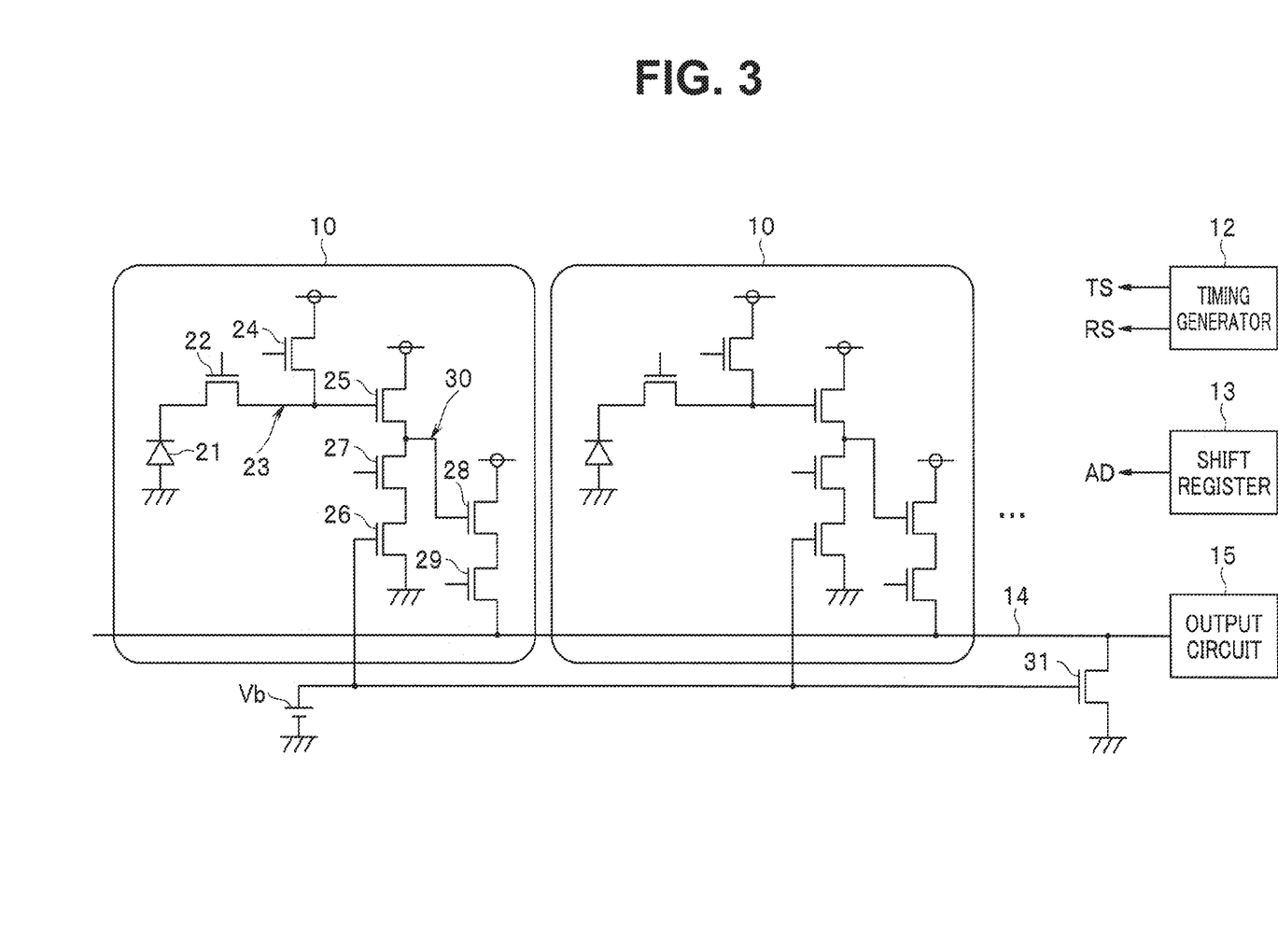
FIG. 3 is a diagram illustrating an example of a circuit configuration of pixel cells in the first embodiment.

FIG. 3 is a diagram illustrating an example of a circuit configuration of pixel cells in the first embodiment. The plurality of pixel cells 10 share a load transistor and an output circuit so that a significantly large resistance and capacitance are added to an output signal line, like in the comparative example. Note that each of transistors illustrated in FIG. 3 may be composed of a p-type transistor, although composed of an n-type transistor.

The pixel cell 10 includes a photodiode 21, the transfer transistor 22, the floating diffusion 23, a reset transistor 24, an amplifier transistor 25, a load transistor 26, a switching transistor 27, an amplifier transistor 28, an address transistor 29, and an intermediate output node 30.

The photodiode 21 has an anode connected to the ground and has an cathode connected to a source of the transfer transistor 22. The photodiode 21 as a light receiving element photoelectrically converts incident light, and stores a signal charge.

The transfer transistor 22 has a gate connected to the timing generator 12, has the source connected to the cathode of the photodiode 21, and has a drain connected to the floating diffusion 23. A transfer control signal TS is inputted from the timing generator 12 to the gate of the transfer transistor 22. The transfer transistor 22 reads out the signal charge stored in the photodiode 21 and transfers the read signal charge to the floating diffusion 23 in response to the transfer control signal TS.

The floating diffusion 23 has one end connected to the drain of the transfer transistor 22 and has the other end connected to a source of the reset transistor 24 and a gate of the amplifier transistor 25. The floating diffusion 23 converts the signal charge into a signal voltage.

The reset transistor 24 has a gate connected to the timing generator 12, has a drain connected to a power supply voltage, and has the source connected to the floating diffusion 23 and the gate of the amplifier transistor 25. A reset signal RS is inputted from the timing generator 12 to the gate of the reset transistor 24. The reset transistor 24 connects the floating diffusion 23 to the power supply voltage and discharges the signal charge in response to the reset signal RS.

The amplifier transistor 25 has the gate connected to the floating diffusion 23, has a drain connected to the power supply voltage, and has a source connected to a drain of the switching transistor 27.

The load transistor 26 has a gate connected to a bias power source Vb, has a drain connected to a source of the switching transistor 27, and has a source connected to the ground.

In the present embodiment, the amplifier transistor 25 and the load transistor 26 constitute a first source follower circuit. An output voltage corresponding to the signal voltage of the floating diffusion 23 inputted to the gate of the amplifier transistor 25 is outputted to the intermediate output node 30.

The switching transistor 27 has a gate connected to the shift register 13, has the drain connected to the source of the amplifier transistor 25, and has the source connected to the drain of the load transistor 26. An address signal AD is inputted from the shift register 13 to the gate of the switching transistor 27. The switching transistor 27 brings the amplifier transistor 25 and the load transistor 26 into a connected state or a disconnected state and controls on/off of the first source follower circuit in response to the address signal AD.

The amplifier transistor 28 has a gate connected to the intermediate output node 30, has a drain connected to the power supply voltage, and has a source connected to a drain of the address transistor 29. The load transistor 31 has a gate connected to the bias power source Vb, has a drain connected to the output signal line 14, and has a source connected to the ground.

In the present embodiment, the amplifier transistor 28 and the load transistor 31 constitute a second source follower circuit. A pixel signal corresponding to an output voltage of the intermediate output node 30 inputted to the gate of the amplifier transistor 28 is outputted to the output circuit 15.

The address transistor 29 has a gate connected to the shift register 13, has the drain connected to the source of the amplifier transistor 28, and has a source connected to the output signal line 14. The address signal AD is inputted to the gate of the address transistor 29. The address transistor 29 brings the amplifier transistor 28 and the load transistor 31 into a connected state or a disconnected state and controls on/off of the second source follower circuit in response to the address signal AD.

Thus, the first and second source follower circuits are connected to each other via the intermediate output node 30. By connecting the intermediate output node 30 as an output of the amplifier transistor 25 to the gate of the amplifier transistor 28, each of the pixel cells 10 outputs the pixel signal to the output signal line 14.

The plurality of pixel cells 10 share the load transistor 31 and the output circuit 15 so that a significantly large resistance and capacitance are added to the output signal line 14, like in the comparative example.

Letting $\Delta V\_FD$ be a voltage change of the floating diffusion 23 due to the charge obtained by the photoelectric conversion, G2 be a gain of the amplifier transistor 25, C_FD be a capacitance of the floating diffusion 23, and C_FDOUT2 be a capacitance between the floating diffusion 23 and the intermediate output node 30, a voltage of the floating diffusion 23 varies as represented by the following expression (2) depending on an output signal:

$$\Delta V\_FD \times G2 \times C\_FDOUT2/C\_FD \quad (2)$$

Since the plurality of pixel cells 10 are connected to the output signal line 14, a wiring length of the output signal line 14 is significantly long. On the other hand, the intermediate output node 30 is a signal line for connecting the amplifier transistor 25 and the amplifier transistor 28 to each other. Accordingly, a wiring length of the intermediate output node 30 is significantly shorter than the wiring length of the output signal line 14. In other words, in the first embodiment, a resistance and a capacitance of the intermediate output node 30 are respectively significantly smaller than the resistance and the capacitance of the output signal line 14. Accordingly, feedback to the floating diffusion 23 more quickly converges than feedback in the circuit configuration in the comparative example.

The intermediate output node 30 is fixed to a predetermined voltage by the floating diffusion 23. Accordingly, even if a voltage of the output signal line 14 changes, the voltage of the intermediate output node 30 does not vary so that feedback does not occur. In the configuration in the comparative example, a signal of the output signal line 54 as a feedback source is slow, which becomes an obstacle to high-speed reading of a pixel signal. In the configuration according to the present embodiment, by speeding up a signal of the intermediate output node 30, the pixel signal can be read out at higher speed.

When a signal having a charge amount Q is inputted to the floating diffusion 23, an amount of voltage change of the floating diffusion 23 is Q/C_FD. In the configuration according to the present embodiment, the resistance and the capacitance of the intermediate output node 30 are small.

Accordingly, a transistor size of the amplifier transistor 25 can be made smaller than a transistor size of the amplifier transistor 28. The floating diffusion 23 is connected to the gate of the amplifier transistor 25. Accordingly, reduction in the transistor size leads to reduction in the capacitance C_FD of the floating diffusion 23. As a result, a voltage amplitude of the floating diffusion 23 can be increased. Accordingly, lower noise and higher sensitivity can be achieved.

Figure 4:
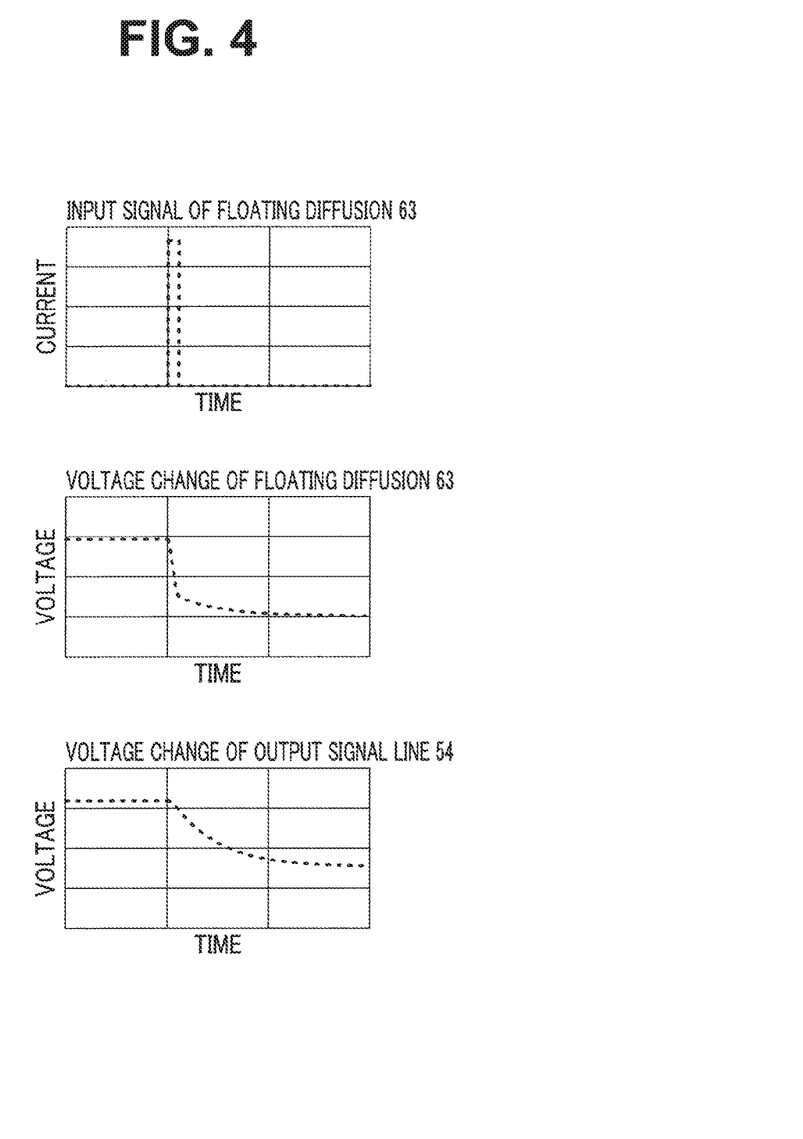
FIG. 4 is a diagram illustrating a simulation result of the circuit configuration in the comparative example by an electronic circuit simulator.
Figure 5:
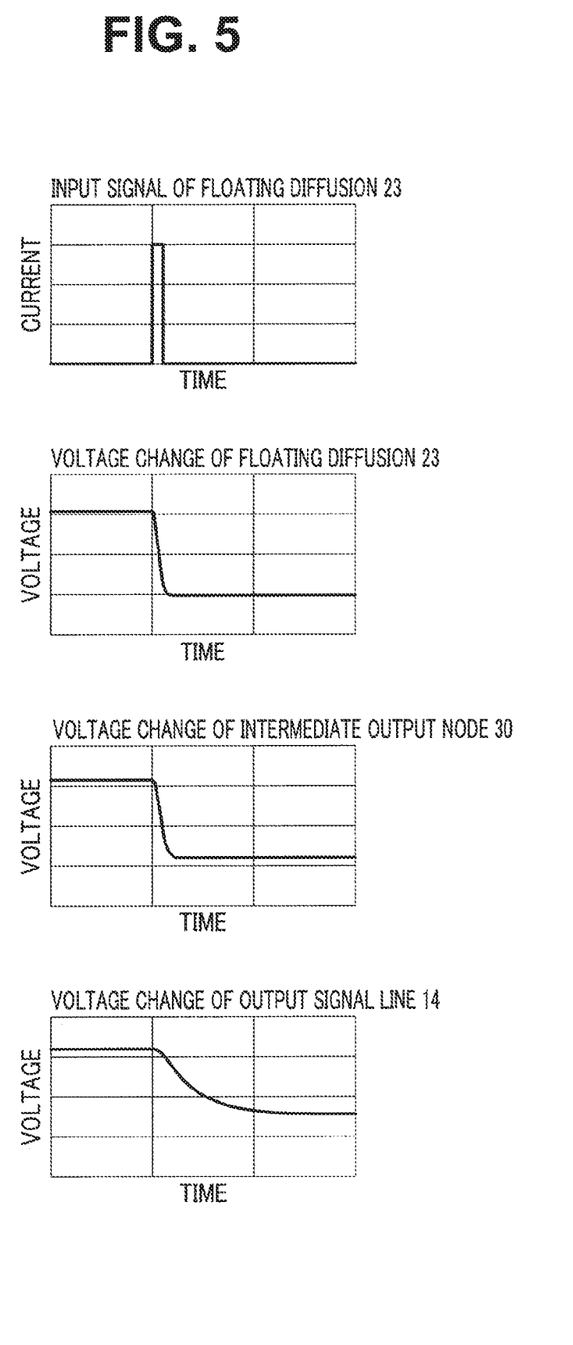
FIG. 5 is a diagram illustrating a simulation result of the circuit configuration according to the first embodiment.
Figure 6:
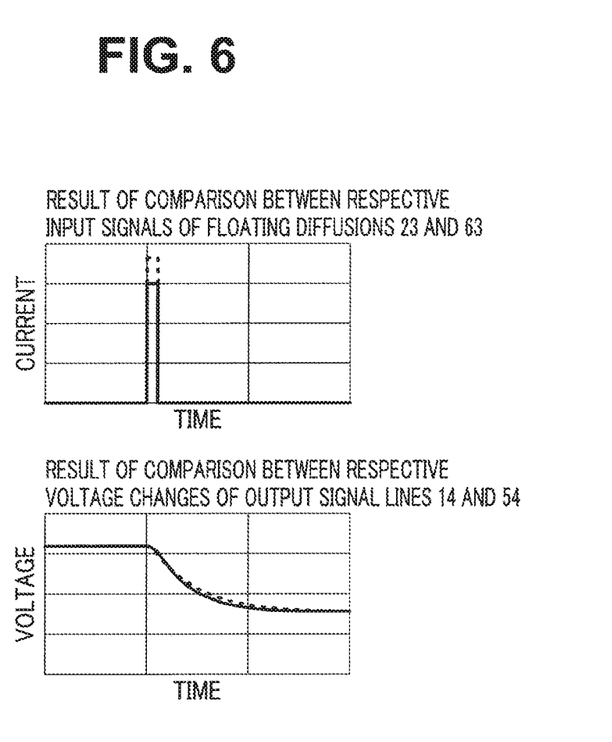
FIG. 6 is a diagram illustrating a result of comparison between the simulations.

FIG. 4 is a diagram illustrating a simulation result of the circuit configuration in the comparative example by an electronic circuit simulator, and FIG. 5 is a diagram illustrating a simulation result of the circuit configuration according to the first embodiment. FIG. 6 is a diagram illustrating a result of comparison between the simulations.

FIG. 4 illustrates an input signal (signal charge) of the floating diffusion 63, a voltage change of the floating diffusion 63, and a voltage change of the output signal line 54 in the order from the top.

On the other hand, FIG. 5 illustrates an input signal (signal charge) of the floating diffusion 23, a voltage change of the floating diffusion 23, a voltage change of the intermediate output node 30, and a voltage change of the output signal line 14 in the order from the top.

FIG. 6 illustrates a result of comparison between respective input signals of the floating diffusions and a result of comparison between respective voltage changes of the output signal lines in the order from the top.

In the simulations, the respective input signals of the floating diffusions in the comparative example and the present embodiment are adjusted such that the respective voltage amplitudes of the output signal lines in the comparative example and the present embodiment match each other. The input signal of the floating diffusion 23 has a smaller current value than a current value of the input signal of the floating diffusion 63, and a sensitivity of the output signal in the present embodiment is higher than a sensitivity of the output signal in the comparative example. The voltage of the output signal line 14 decreases more quickly than the voltage of the output signal line 54, and convergence of the output signal line 14 is improved compared with convergence of the output signal line 54.

As described above, the solid-state imaging device 1 according to the present embodiment can read out the pixel signal at high speed by improving the convergence of the output signal line 14 compared with the convergence of the output signal line 54 in the conventional circuit configuration (in the comparative example).

Second Embodiment

Figure 7:
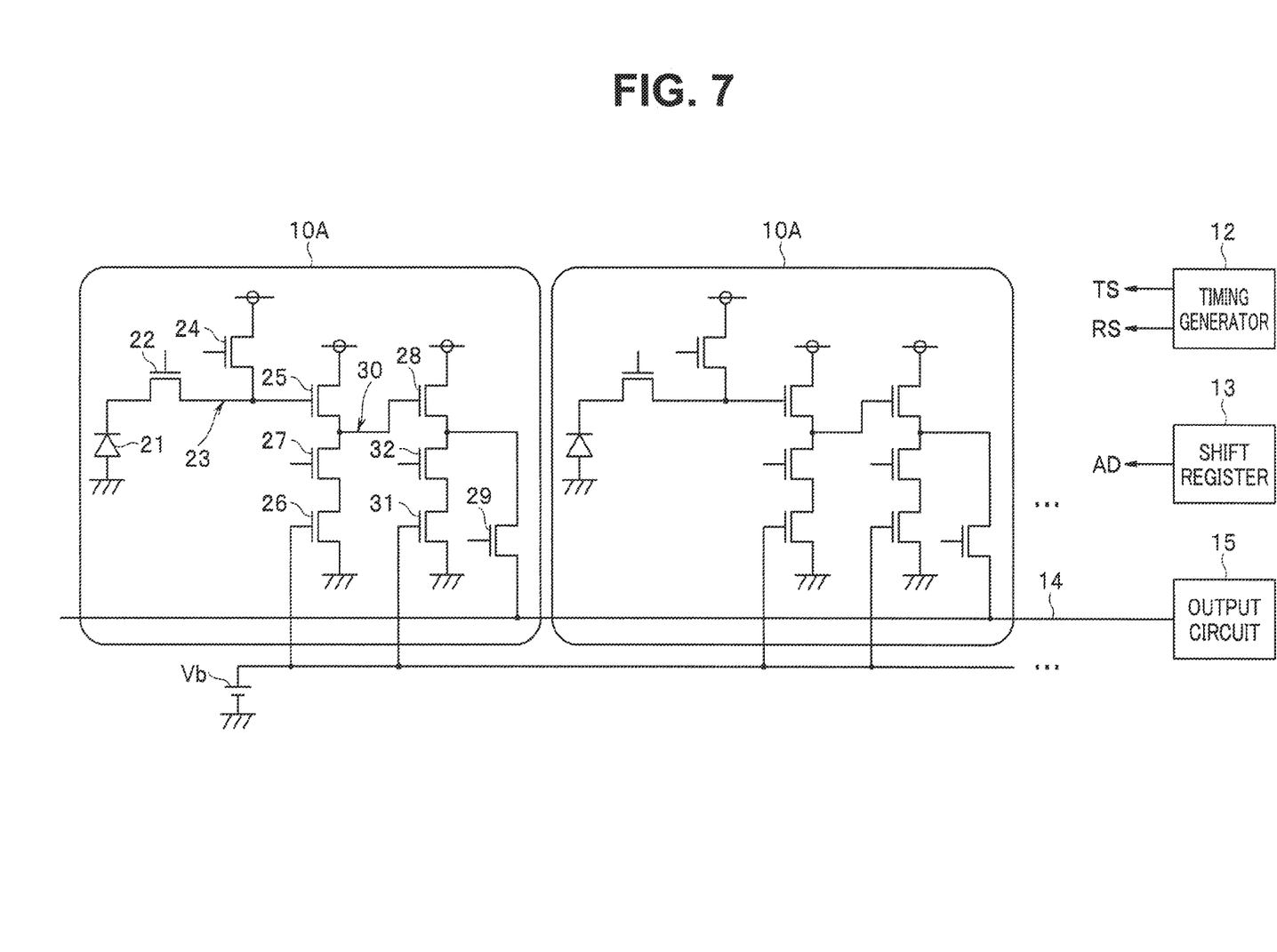
FIG. 7 is a diagram illustrating an example of a circuit configuration of pixel cells in a second embodiment.

FIG. 7 is a diagram illustrating an example of a circuit configuration of pixel cells in a second embodiment. Note that similar components to the components illustrated in FIG. 3 are assigned the same reference numerals, and hence description of the components is omitted in FIG. 7. Although the load transistor 31 constituting the second source follower circuit is arranged outside the pixel cell 10 in the first embodiment, a load transistor 31 is arranged inside a pixel cell 10A in the second embodiment.

A switching transistor 32 is arranged between an amplifier transistor 28 and the load transistor 31. The switching transistor 32 has a gate connected to a shift register 13, has a drain connected to a source of the amplifier transistor 28, and has a source connected to the load transistor 31. An address signal AD is inputted to the gate of the switching transistor 32. The switching transistor 32 brings the amplifier transistor 28 and the load transistor 31 into a connected state or a disconnected state and controls on/off of a second source follower circuit in response to the address signal AD.

As described above, in the second embodiment, the load transistor 31 is arranged within the pixel cell 10A so that an output signal line 14 is not a power supply wiring. Accordingly, in the second embodiment, an IR drop as a voltage drop caused by a product of a current and a resistance (wiring resistance) generated on the power supply wiring does not occur on the output signal line 14 so that an output level of the pixel cell 10A can be kept constant.

In a configuration according to the second embodiment, first and second source follower circuits are connected in series in two stages so that a similar effect to the effect in the first embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a plurality of pixel cells connected to an output signal line, wherein
   each of the pixel cells comprises
   a photodiode configured to photoelectrically convert incident light and store a signal charge,
   a floating diffusion configured to convert the signal charge read out of the photodiode into a signal voltage,
   a first source follower circuit connected to the floating diffusion and configured to output an output voltage corresponding to the signal voltage, and
   a second source follower circuit connected in series with the first source follower circuit and configured to output a pixel signal corresponding to the output voltage, wherein
   the first source follower circuit includes a first amplifier transistor and a first load transistor,
   the second source follower circuit includes a second amplifier transistor and a second load transistor,
   the second load transistor is shared among the plurality of pixel cells via the output signal line, and
   a size of the first amplifier transistor is smaller than a size of the second amplifier transistor.

2. The solid-state imaging device according to claim 1, wherein
   the first source follower circuit and the second source follower circuit are connected to each other by an intermediate output node, and
   a resistance and a capacitance of the intermediate output node are respectively smaller in value than a resistance and a capacitance of the output signal line.

3. The solid-state imaging device according to claim 1, further comprising
   a timing generator configured to generate a pulse signal according to a control signal, and
   a shift register configured to generate an address signal for selecting the pixel cell that outputs the pixel signal based on the pulse signal.

4. The solid-state imaging device according to claim 3, further comprising
   an output circuit configured to subject the pixel signal outputted from the selected pixel cell to predetermined signal processing and output the pixel signal.

5. The solid-state imaging device according to claim 3, further comprising
   a switching transistor configured to control on/off of the first source follower circuit in response to the address signal.

6. The solid-state imaging device according to claim 3, further comprising
   an address transistor configured to control on/off of the second source follower circuit in response to the address signal.

7. The solid-state imaging device according to claim 3, further comprising
   a reset transistor configured to discharge the signal charge in the floating diffusion.

8. The solid-state imaging device according to claim 7, wherein
   the timing generator generates a reset signal for discharging the signal charge in the floating diffusion and outputs the reset signal to the reset transistor.

9. The solid-state imaging device according to claim 3, further comprising
   a transfer transistor configured to read out the signal charge stored in the photodiode and transfer the signal charge to the floating diffusion.

10. The solid-state imaging device according to claim 9, wherein
    the timing generator generates a transfer control signal for reading out the signal charge stored in the photodiode and transferring the signal charge to the floating diffusion, and outputs the transfer control signal to the transfer transistor.

* * * * *